(12) United States Patent
Kanar et al.

(10) Patent No.: US 10,790,594 B2
(45) Date of Patent: Sep. 29, 2020

(54) WIDEBAND VECTOR MODULATOR AND PHASE SHIFTER

(71) Applicant: Integrated Device Technology, Inc., San Jose, CA (US)

(72) Inventors: Tumay Kanar, San Diego, CA (US); Samet Zihir, San Diego, CA (US); Naveen Krishna Yanduru, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 25 days.

(21) Appl. No.: 16/131,296

(22) Filed: Sep. 14, 2018

(65) Prior Publication Data

US 2019/0089308 A1 Mar. 21, 2019

Related U.S. Application Data

(60) Provisional application No. 62/560,173, filed on Sep. 18, 2017, provisional application No. 62/559,875, filed on Sep. 18, 2017.

(51) Int. Cl.
*H03F 3/45* (2006.01)
*H01Q 21/00* (2006.01)
(Continued)

(52) U.S. Cl.
CPC ....... *H01Q 21/0006* (2013.01); *H01Q 1/2283* (2013.01); *H01Q 1/48* (2013.01); *H01Q 1/523* (2013.01); *H01Q 1/526* (2013.01); *H01Q 3/28* (2013.01); *H01Q 3/36* (2013.01); *H01Q 19/30* (2013.01); *H01Q 21/0025* (2013.01); *H01Q 21/062* (2013.01); *H01Q 21/065* (2013.01); *H03F 1/0211* (2013.01); *H03F 1/0261* (2013.01); *H03F 1/3282* (2013.01); *H03F 1/565* (2013.01); *H03F 3/19* (2013.01); *H03F 3/195* (2013.01); *H03F 3/245* (2013.01); *H03F 3/45089* (2013.01); *H03F 3/45475* (2013.01);
(Continued)

(58) Field of Classification Search
CPC .... H03F 3/68; H03F 3/45475; H03F 3/45089; H03F 3/195; H03F 1/3282; H03F 1/0261; H03F 1/0211; H03F 3/245; H03F 3/19; H03F 1/565; H03F 2200/451; H03F 2200/387; H03F 2200/294
USPC .................................................. 330/253, 254
See application file for complete search history.

(56) References Cited

U.S. PATENT DOCUMENTS

| | | | |
|---|---|---|---|
| 7,889,005 B2 * | 2/2011 | Simon | H03F 1/223 330/254 |
| 2006/0202760 A1 | 9/2006 | Simon | 330/254 |
| 2011/0063030 A1 * | 3/2011 | Jang | H03F 3/45188 330/254 |

* cited by examiner

*Primary Examiner* — Khanh V Nguyen
*Assistant Examiner* — Khiem D Nguyen
(74) *Attorney, Agent, or Firm* — Christopher P. Maiorana, PC

(57) ABSTRACT

An apparatus includes a first circuit and a plurality of second circuits. The first circuit may be configured to generate a pair of quadrature signals from a radio-frequency signal. The second circuits may each comprise a plurality of cascode amplifiers. The cascode amplifiers may be connected in parallel. The cascode amplifiers may be configured to generate a plurality of intermediate signals by modulating the quadrature signals in response to a first control signal and a second control signal. The first control signal generally switches a contribution of the cascode amplifiers in the generation of the intermediate signal. The second control signal may adjusts a total current passing through all of the cascode amplifiers.

14 Claims, 9 Drawing Sheets

(51) Int. Cl.

| | |
|---|---|
| *H04B 1/44* | (2006.01) |
| *H03F 1/56* | (2006.01) |
| *H03F 3/19* | (2006.01) |
| *H03G 3/30* | (2006.01) |
| *H03F 3/24* | (2006.01) |
| *H03F 1/32* | (2006.01) |
| *H03F 3/195* | (2006.01) |
| *H03F 3/68* | (2006.01) |
| *H04B 1/04* | (2006.01) |
| *H04B 1/18* | (2006.01) |
| *H04B 1/48* | (2006.01) |
| *H03K 21/10* | (2006.01) |
| *H04B 7/06* | (2006.01) |
| *H01Q 1/52* | (2006.01) |
| *H01Q 3/28* | (2006.01) |
| *H01Q 3/36* | (2006.01) |
| *H01Q 19/30* | (2006.01) |
| *H01Q 21/06* | (2006.01) |
| *H03F 1/02* | (2006.01) |
| *H01Q 1/48* | (2006.01) |
| *H01Q 1/22* | (2006.01) |
| *H03H 7/48* | (2006.01) |
| *H04B 1/401* | (2015.01) |

(52) U.S. Cl.
CPC ............. *H03F 3/68* (2013.01); *H03G 3/3042* (2013.01); *H03H 7/487* (2013.01); *H03K 21/10* (2013.01); *H04B 1/0458* (2013.01); *H04B 1/18* (2013.01); *H04B 1/401* (2013.01); *H04B 1/44* (2013.01); *H04B 1/48* (2013.01); *H04B 7/0617* (2013.01); *H03F 2200/294* (2013.01); *H03F 2200/387* (2013.01); *H03F 2200/451* (2013.01)

WIDEBAND VECTOR MODULATOR AND PHASE SHIFTER

This application relates to U.S. Provisional Application No. 62/559,875, filed Sep. 18, 2017 and U.S. Provisional Application No. 62/560,173, filed Sep. 18, 2017, each of which are hereby incorporated by reference in their entirety.

FIELD OF THE INVENTION

The invention relates to radio-frequency beam forming generally and, more particularly, to a method and/or apparatus for implementing a wideband vector modulator and phase shifter.

BACKGROUND

Phased array antenna panels are used to generate steerable beams that may be utilized in wireless communication systems. Phased arrays create a focused beam that can be steered very quickly to maintain a link for any on-the-move communication system. The steering involves changing the phases of radio-frequency signals that establish the steerable beams. However, conventional phase shifting circuitry is subject to process-voltage-temperature drifting and phase stability issues at various input power levels.

It would be desirable to implement a wideband vector modulator and phase shifter.

SUMMARY

The invention concerns an apparatus including a first circuit and a plurality of second circuits. The first circuit may be configured to generate a pair of quadrature signals from a radio-frequency signal. The second circuits may each comprise a plurality of cascode amplifiers. The cascode amplifiers may be connected in parallel. The cascode amplifiers may be configured to generate a plurality of intermediate signals by modulating the quadrature signals in response to a first control signal and a second control signal. The first control signal generally switches a contribution of the cascode amplifiers in the generation of the intermediate signal. The second control signal may adjust a total current passing through all of the cascode amplifiers.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a wideband vector modulator and phase shifter that may (i) be applied to any amplifier, (ii) be implemented with cascode amplifiers, (iii) provide process, voltage and temperature resilience, (iv) introduce low phase errors, (v) introduce low gain errors, (vi) be implemented using a variety of semiconductor technologies, and/or (vii) be implemented as one or more integrated circuits.

Figure 1:
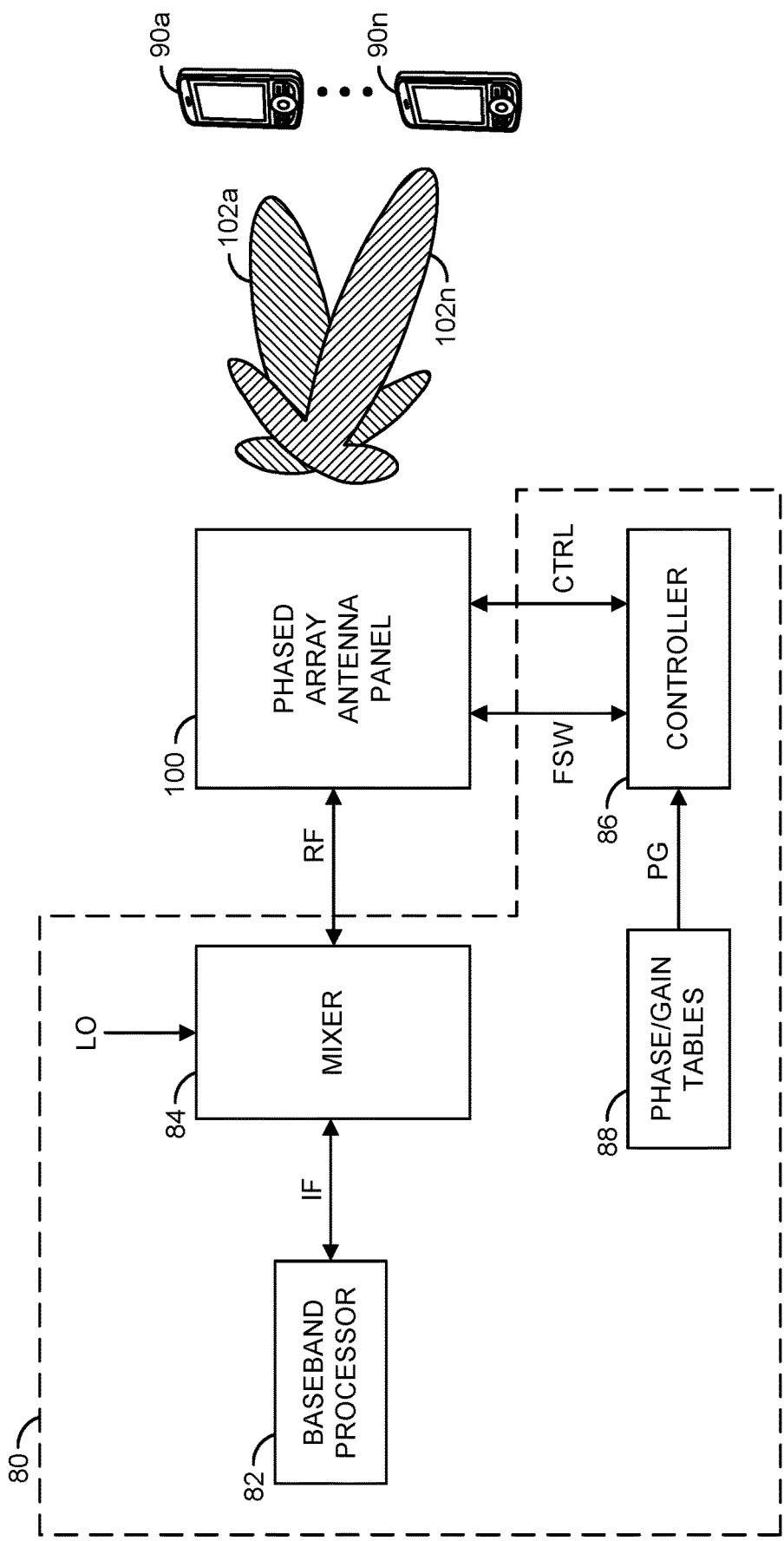
FIG. 1 is a diagram of a system illustrating a context of the invention.

Referring to FIG. 1, a block diagram of a system 80 is shown illustrating an example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 100 in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radio-communication Sector (ITU-R)), a satellite communication (SATCOM) system, and point-to-point communications systems such as a common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware, a combination of hardware and software, and/or simulated with software.

A signal (e.g., IF) may be exchanged between the circuit and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 100. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 100 to the devices 90a-90n. In a receive mode, the radio-frequency signal RF may convey information received from the devices 90a-90n via the phased array antenna panel 100. A signal (e.g., FSW) and a signal or signals (e.g., CTRL) may be exchanged between the circuit 86 and the phased array antenna panel 100. The signal FSW may switch the phased array antenna panel 100 between the transmit mode and the receive mode. The signal(s) CTRL may convey data, clocking, and control elements. In an example, the signals FSW and CTRL may be part of a digital interface of the phased array antenna panel 100. In an example, the signal(s) CTRL may be implemented as a serial link that conveys information for configuring and/or determining phase and/or gain settings for antenna elements of the phased array antenna panel 100. In an example, the signal(s) CTRL may be compliant with one or more serial communication protocols or interfaces (e.g., serial peripheral interface (SPI), inter-integrated circuit communications (I$^2$C), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 100. In an example, the signal(s) PG may convey a plurality of phase and gain valves that may be programmed into a plurality of beam former circuits of the phased array antenna panel 100 via the signal(s) CTRL.

The phased array antenna panel 100 generally implements a hard-wired address scheme. The hard-wired address scheme may be used to uniquely identify serial communications intended for elements (e.g., the beam former circuits) of the phased array antenna panel 100. In various embodiments, multiple phased array antenna panels 100 may be combined to form a larger antenna array that may provide more transmission channels. The multiple phased array antenna panels may share a serial communication channel, link, or bus. Each of the phased array antenna panels 100 making up the larger antenna array may be uniquely addressed using respective hard-wired addresses.

The phased array antenna panel 100 may generate one or more fields (or beams) 102a-102n. The fields 102a-102n may represent a field pattern (or radio-frequency beam pattern) created by the beam former circuits of the phased array antenna panel 100 based upon the phase and gain information (values) received via the signal(s) CTRL. The phased array antenna panel 100 may be configured to produce directional beams 102a-102n for communication with the communication devices 90a-90n. In an example, the phased array antenna panel 100 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4-GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 100. In some embodiments, the circuit 86 may determine the setting values used in each transceiver channel within the beam former circuits of the phased array antenna panel 100. The setting values may establish the geometry of the field(s) or beam(s) 102a-102n. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the phased array antenna panel 100 to establish the fields 102a-102b. The phase values and the gain values may be fetched from the circuit 88 via the signal PG and programmed into buffers associated with the beam former circuits of the phased array antenna panel 100 by the circuit 86. In various embodiments, the circuits 86 and 88 may be implemented either on the same integrated circuit or on different (separate) integrated circuits.

In an example, the phased array antenna panel 100 may be implemented comprising either single-polarization (or single-pole) antenna elements or dual-polarization (or dual-pole or di-pole) antenna elements. The phased array antenna panel 100 may be operational to transmit and receive wireless signals to and from the devices (or terminals) 90a-90n. The devices (or terminals) 90a-90n may be remotely located from the RF transceiver system 80. Sensitivity to the wireless signals may be determined by the fields 102a-102n created by the phased array antenna panel 100. The phased array antenna panel 100 may comprise a plurality of antenna elements and a plurality of beam former circuits. Each beam former circuit may implement a plurality of transceiver channels. Each transceiver channel generally comprises a transmit channel and a receive channel. The transceiver channels may be coupled to the antenna elements by corresponding bidirectional radio-frequency signals. The transceiver channels and antenna elements generally form a two-dimensional antenna network.

Figure 2:
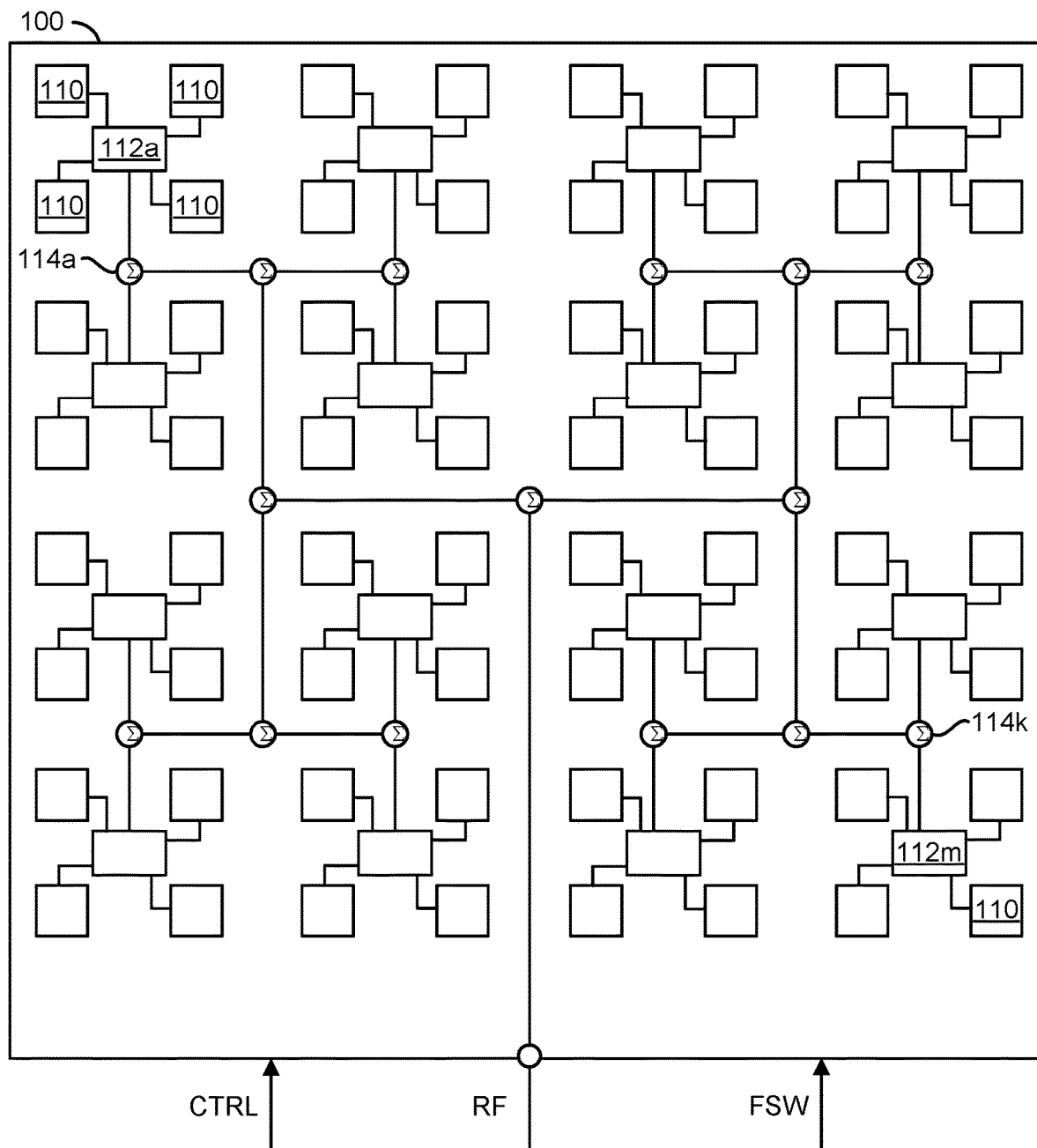
FIG. 2 is a diagram illustrating a single-polarization phased array antenna panel in accordance with an example embodiment of the invention.

Referring to FIG. 2, a diagram is shown illustrating an example implementation of a single-polarization version of the phased array antenna panel 100 in accordance with an embodiment of the invention. In an example, the phased array antenna panel 100 may comprise a number of blocks (or circuits) 110, a number of blocks (or circuits) 112a-112m, and a number of blocks (or circuits) 114a-114k. In embodiments implementing a single-polarization phased array antenna panel, the blocks 110 generally are implemented as single polarization (or single-pole) antenna elements. Each of the circuits 112a-112m may implement a single-polarization beam former circuit. Each of the circuits 114a-114k may implement a combiner/splitter circuit. The circuits 112a-112m, and 114a-114k may be implemented with hardware, a combination of hardware and software, and/or simulated with software. In an example, the signal RF may be exchanged with one of the circuits 114a-114k. The signals FSW and CTRL may be exchanged with the circuits 112a-112m.

The antenna elements 110 in the phased array antenna panel 100 may be used for both transmission and reception. A physical positioning of the antenna elements 110 generally provides for two-dimensional (e.g., horizontal and vertical) control of the fields 102a-102n. In an example, the antenna elements 110 may be arranged in a 2-dimensional (e.g., N×N) grid pattern, where N is an integer value divisible by 2. However, other dimensions of grid patterns may be implemented accordingly to meet design criteria of a particular implementation.

The circuits 112a-112m are generally operational to multiplex/demultiplex the signal RF with a number of the antenna elements 110. In various embodiments, each of the circuits 112a-112m may be mounted on a substrate of the phased array antenna panel 100 adjacent to (e.g., centered among) a number (or group) of the antenna elements 110. In an example, each circuit 112a-112m generally comprises a number of transceiver channels that are coupled to respective antenna elements 110. In an example, each circuit 112a-112m may be coupled to four adjacent antenna elements 110 (e.g., arranged in a 2×2 grid around each circuit 112a-112m). However, other numbers (e.g., 1, 2, 4, 18, etc.) of adjacent antenna elements 110 may be implemented to meet design criteria of a particular implementation. The circuits 112a-112m may be configured to switch between a transmit mode and a receive mode in response to the signal FSW. In the transmit mode, the circuits 112a-112m may be operational to rapidly change setting values (e.g., phase values, gain values, etc.) used by the transceiver channels in order to steer the beams (or fields) 102a-102n formed by the phased array antenna panel 100. In various embodiments, each of the circuits 112a-112m may be implemented as one or more integrated circuits (e.g., in a package or multi-chip module (MCM)).

In various embodiments, each of the circuits 114a-114k may be implemented as a combiner/splitter circuit. In an example, the circuits 114a-114k may be implemented as Wilkinson combiner/splitters. In various embodiments, the circuits 114a-114k may be coupled together to form a network that couples the circuits 112a-112m to an input/output of the phased array antenna panel 100 configured to present/receive the signal RF. In the transmit mode, the circuits 114a-114k are generally operational to distribute the power in the signal RF among the circuits 112a-112m. In the receive mode, the circuits 114a-114k may be operational to combine the power received in signals from the circuits 112a-112m into the signal RF. The circuits 112a-112n and 114a-114k are generally configured to provide a substantially equivalent path length between the RF input/output of the phased array antenna panel 100 and each of the circuits 112a-112m.

Figure 3:
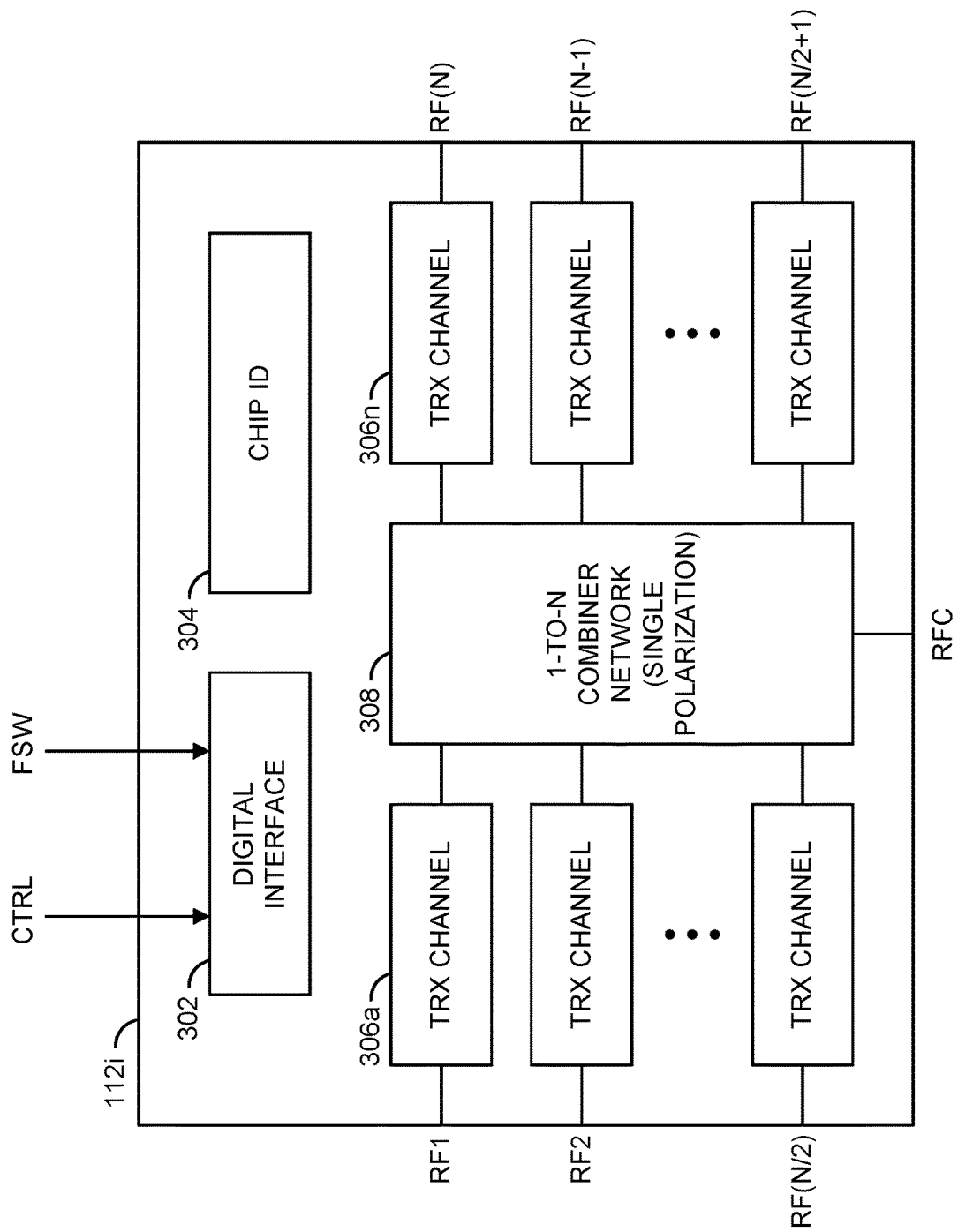
FIG. 3 is a diagram illustrating a single-polarization beam former circuit in accordance with an example embodiment of the invention.

Referring to FIG. 3, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 112i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 112i generally implements a transmit mode and a receive mode. In an example, a state of the signal FSW may determine whether the transmit mode or the receive mode is active. In the transmit mode, the single-polarization beam former circuit 112i is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 112i in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112i is generally configured to combine radio frequency signals received at the antenna input/output ports RF1-RFN for presentation as the signal RF at the common input/output port RFC.

The single-polarization beam former circuit 112i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112i. The circuits 306a-306n may implement transceiver (TRX) channels. The circuit 308 may implement a 1-to-N combiner/splitter network.

In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit ($I^2C$), daisy chain, etc. In an example, the circuit 302 may be configured to allow programming and control of the single-polarization beam former circuit 112*i* using a serial communication link (or bus). In an example, the circuit 302 may be configured to program and control the circuits 306*a*-306*n* in response to the signals CTRL and FSW. In an example, the circuit 302 may control whether the circuits 306*a*-306*n* operate in a transmit mode or a receive mode in response to the signal FSW. In an example, the circuit 302 may implement a 4-wire embedded SPI core. In an example, the circuit 304 may set a physical address of the beam former circuit 112*i* based upon hardware coded address bits (or pins). In some embodiments, the hard-wired address bits may be hard coded within the chip implementing the beam former 112*i*. In some embodiments, the hard-wired address bits may be programmable within the chip implementing the beam former 112*i* during manufacturing. In an example, the hard-wired address bits may be programmed using fuses, anti-fuses, or other conventional techniques.

Figure 4:
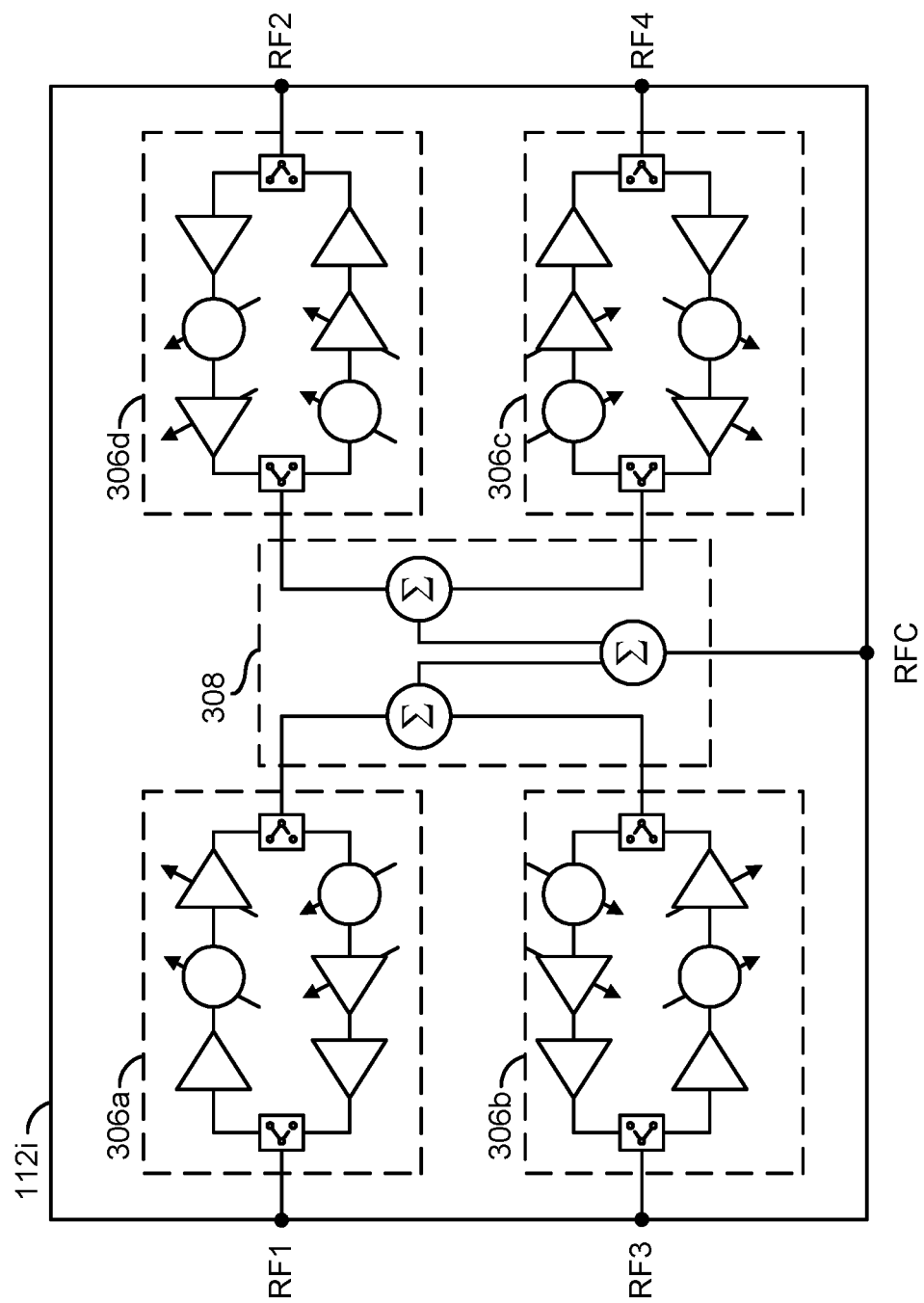
FIG. 4 is a diagram illustrating a four transceiver channel single-polarization beam former circuit in accordance with an example embodiment of the invention.

Referring to FIG. 4, a diagram is shown illustrating an example implementation of a generic 2×2 four-element single-polarization transceiver beam former circuit 112*i* in accordance with an example embodiment of the invention. In various embodiments, beam former circuits may implement a plurality of transceiver channels. Each transceiver channel generally comprises a transmit channel and a receive channel. In an example, the 2×2 four-element single-polarization transceiver beam former circuit 112*i* may implement four transceiver channels 306*a*-306*d*. The four transceiver channels (or circuits) 306*a*-306*d* may be coupled to respective antenna elements in a group of adjacent antenna elements by corresponding bidirectional radio-frequency signals (e.g., RF1-RF4). The transceiver channels and antenna elements generally form a two-dimensional antenna network.

In an example, the circuit 308 may be implemented as a 1-4 combiner/splitter network. In an example, the circuit 308 may comprise a number of combiner/splitters. In an example, the combiner/splitters may be implemented as Wilkinson combiner/splitters. In various embodiments, the combiner/splitters may be coupled together to form a network that couples the circuits 306*a*-306*d* to a common RF input/output port RFC of the beam former circuit 112*i*. In the transmit mode, the circuit 308 is generally operational to distribute the power in a signal at the common RF input/output port RFC among the circuits 306*a*-306*d*. In the receive mode, the circuit 308 may be operational to combine the power received in signals from the circuits 306*a*-306*d* into a signal presented at the common RF input/output port RFC. The circuits 306*a*-306*d* and 308 are generally configured to provide a substantially equivalent path length between the common RF input/output port RFC and each of the circuits 306*a*-306*d*. The topology of the beam former circuit 112*i* may be scaled to provide other numbers of transceiver channels to meet the design criteria of a particular implementation.

Figure 5:
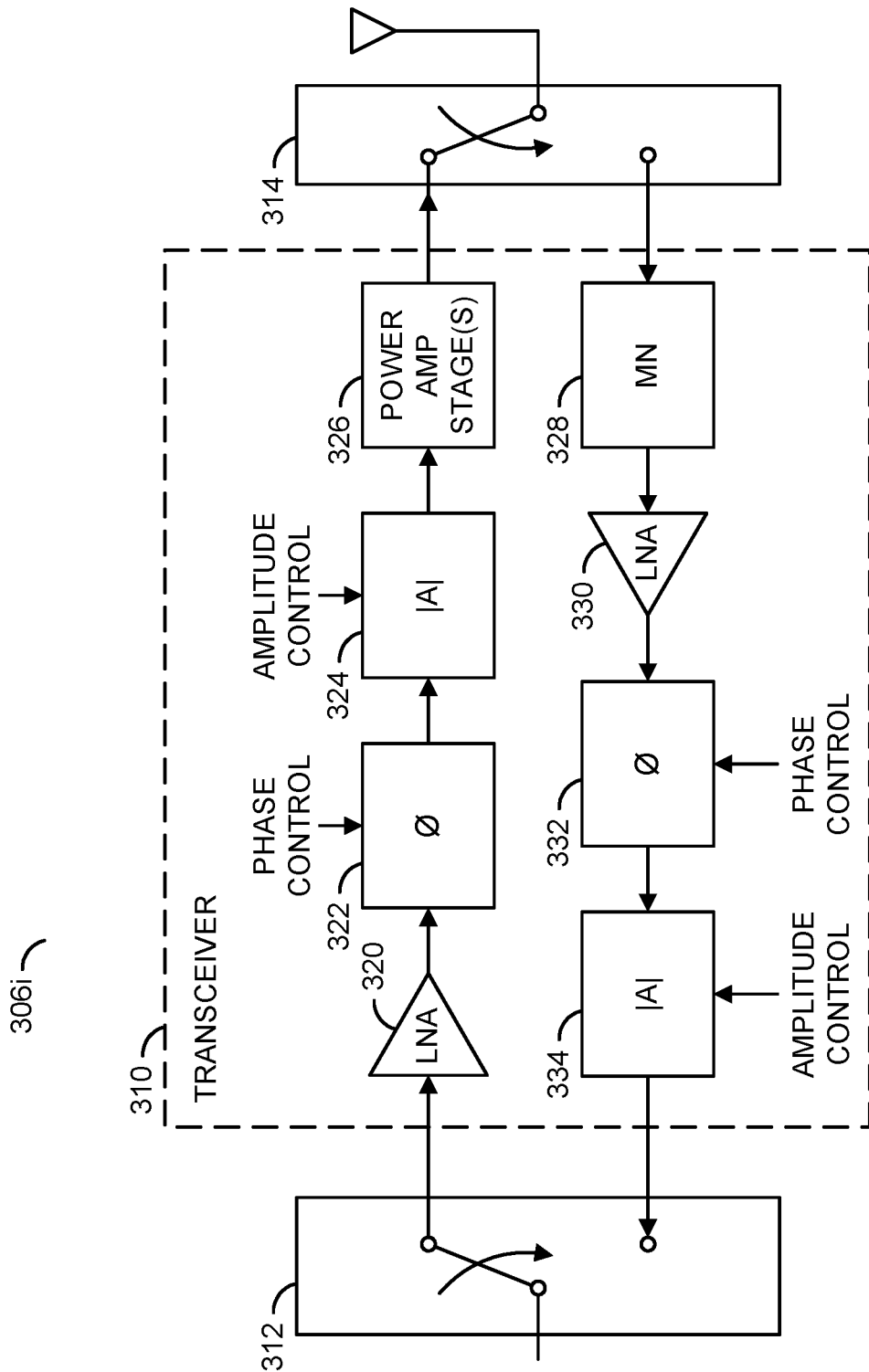
FIG. 5 is a diagram illustrating a transceiver circuit in accordance with an example embodiment of the invention.

Referring to FIG. 5, a block diagram of a transceiver circuit 306*i* is shown illustrating an example radio frequency (RF) amplifier application in accordance with an embodiment of the invention. In an example, the transceiver circuit 306*i* may be representative of the single-polarization beam former transceiver circuits (or channels) 306*a*-306*d* of FIG. 4. In an example embodiment, the circuit 306*i* may comprise a block (or circuit) 310, a block (or circuit) 312, and a block (or circuit) 314. In an example embodiment, the circuit 310 may implement a transceiver circuit. The blocks 312 and 314 may implement transmit-receive (T/R) switches. A transceiver circuit is generally capable of both transmitting and receiving signals of a communication channel. In various embodiments, the circuit 310 may be capable of transmitting and receiving radio frequency (RF), microwave, and/or millimeter-wave signals.

In various embodiments, the circuit 310 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 310 may be representative of a radar application including, but not limited to target detection, ranging, and/or through-wall imaging. In an example, the transceiver circuit 310 generally comprises both a transmitter chain and a receiver chain. Both the transmitter chain and the receiver chain may comprise radio frequency (RF) amplifiers.

In an example, the transmitter chain may include an input amplifier 320, a variable (programmable) phase shifter 322, a variable (programmable) attenuator 324, and one or more output amplifier stages 326. In an example, the input amplifier 320 may be implemented as a low noise amplifier (LNA). The output amplifier stages 326 may include drivers, pre-amplifiers, and/or power amplifiers. In an example, the receiver chain may include a limiter (or protection) and filter (MN) circuit 328, a low noise amplifier (LNA) 330, a variable (programmable) phase shifter 332, and a variable (programmable) attenuator 334. In an example, an input of the transmitter chain and an output of the receiver chain may be coupled to a transmission line or an RF transceiver system by the RF switch 312. In an example, an output of the transmitter chain and an input of the receiver chain may be coupled to a transmission line or an antenna by the RF switch 314.

In various embodiments, the variable phase shifter 322, the variable attenuator 324, the variable phase shifter 332, and the variable attenuator 334 may be implemented using conventional techniques. In various embodiments, amplifier output return loss and back-off performance improvement using an RC feedback network in accordance with an example embodiment of the invention may be implemented in connection with any or all of the input amplifier 320, the power amplifier stage(s) 326, and the low noise amplifier (LNA) 330 of the transceiver circuit 310.

Figure 6:
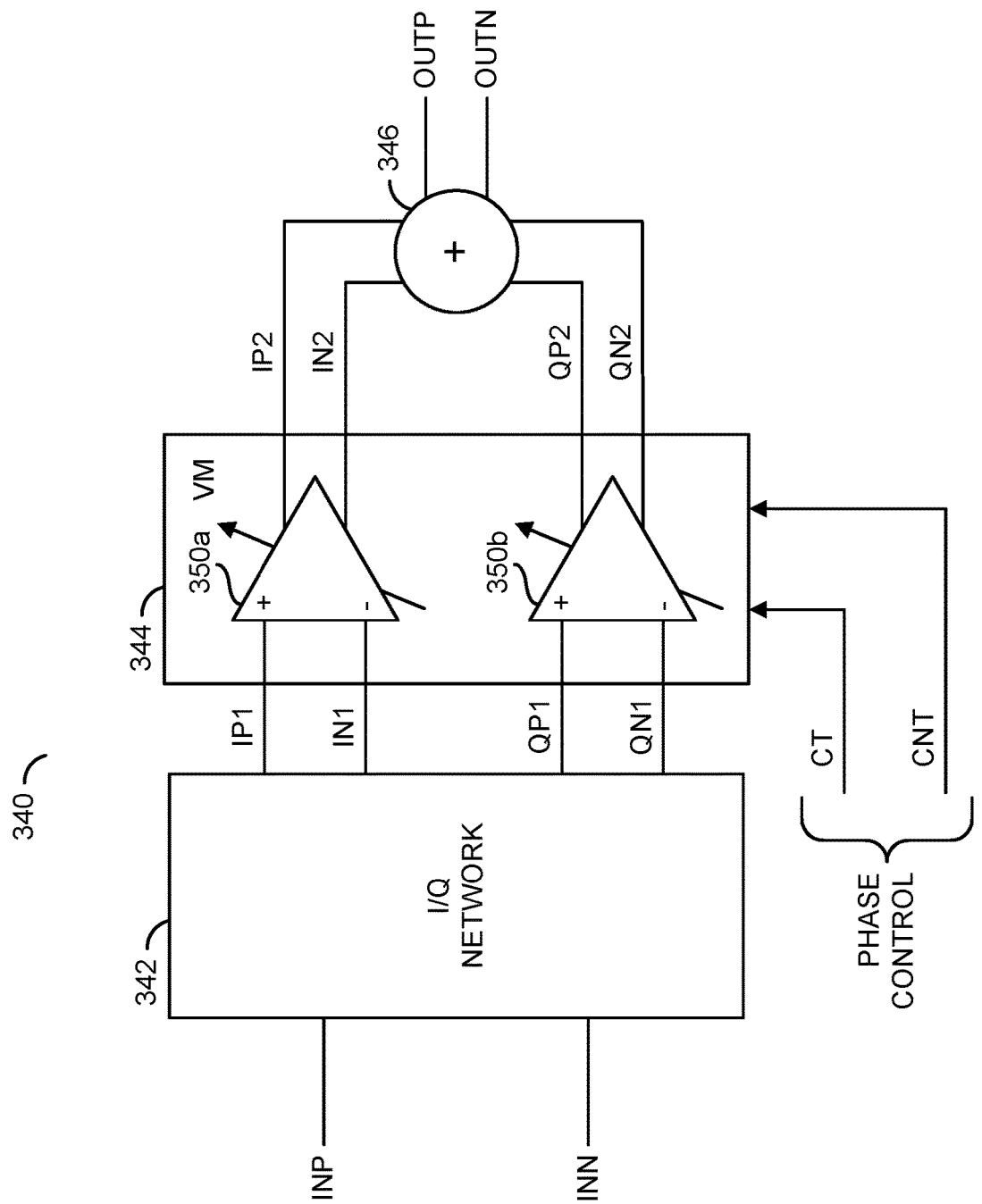
FIG. 6 is a diagram illustrating a variable phase shifter in accordance with an example embodiment of the invention

Referring to FIG. 6, a diagram illustrating an example implementation of a variable phase shifter 340 is shown in accordance with an example embodiment of the invention. The variable phase shifter 340 may be representative of the variable phase shifter 322 and/or the variable phase shifter 332 in FIG. 5. The variable phase shifter 340 generally provides a high resolution (e.g., 6-bit) programmability with a low gain variation. The phase shifter 340 may be resilient to process variations, voltage variations and temperature variations. Phase stability may also be provided over wide input power levels.

The variable phase shifter 340 generally comprises a block (or circuit) 342, a block (or circuit) 344 and a block (or circuit) 346. The circuit 344 may include multiple blocks (or circuits) 350*a*-350*b*. In an example embodiment, the circuit 342 may implement an I/Q network. The circuit 344 may implement a vector modulator (VM) circuit. The circuit 346 may implement a summation circuit. Each circuit 350*a*-350*b* may implement a variable gain amplifier (VGA). The variable phase shifter 340 may provide a hybrid gain scaling and vector modulation with the variable gain amplifier cores using cascode amplification core switching and bias scaling. The cascode amplification generally provides wide bandwidth amplification, a high gain, and a moderately high input impedance. The variable phase shifter 340 may also provide a wideband quadrature all-pass filter (QAF) design that may utilize voltage mode optimization of a QAF core (e.g., the circuit 342) ahead of the variable gain amplifier (VGA) cores (e.g., the circuits 350a-350b).

The I/Q network 342 may receive a differential input signal (e.g., INP and INN) from a low noise amplifier 320 or 330. A pair of quadrature differential signals (e.g., IP1 and IN1, QP1 and QN1) may be generated by the I/Q network 342. The signals IP1/IN1 may have a 90-degree phase difference relative to the signals QP1/QN1.

The vector modulator 344 may receive a multi-bit coarse control signal (e.g., CT) and a multi-bit fine control signal (e.g., CNT). The signals CT and CNT may be part of a signal (e.g., PHASE CONTROL) received by the variable phase shifters 322 and 332 (FIG. 5). The signal PHASE CONTROL may be part of the signal CTRL generated by the controller 86 (FIG. 1). Each amplifier 350a-350b may receive the signal CT and the signal CTL.

The amplifiers 350a-350b may receive the differential signals IP1/IN1 and QP1/QN1, respectively. Each amplifier 350a-350b may be operational to generate a corresponding differential output signal (e.g., IP2/IN2 and QP2/QN2) by adjusting the gain of the input signals based on the control signals CT and CNT.

The differential signals IP2/IN2 and QP2/QN2 may be received by the summation circuit 346. The summation circuit 346 is generally operational to combine the quadrature components of the differential signals IP2/IN2 and QP2/QN2 to generate a differential output signal (e.g., OUTP and OUTN). Based on the relative amplitudes of the signals IP2/IN2 to the signals QP2/QN2, the differential output signal OUTP/OUTN may have a variable programmable phase relative to the differential input signal INP/INN. The differential signal OUTP/OUTN may be presented to the corresponding variable attenuators 324 and 334 (FIG. 5).

Figure 7:
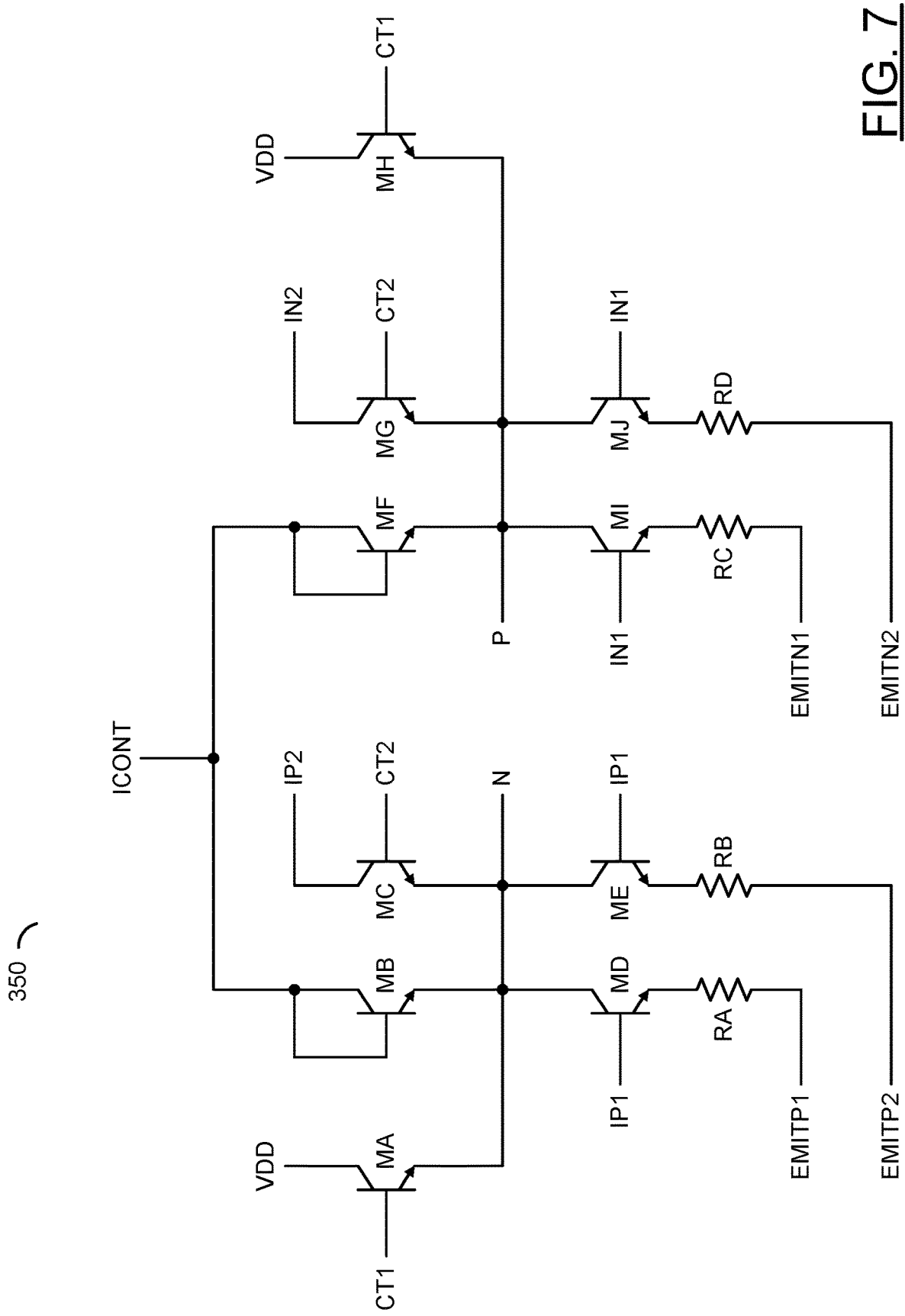
FIG. 7 is a diagram illustrating a variable gain amplifier in accordance with an example embodiment of the invention.

Referring to FIG. 7, a diagram illustrating an example implementation of an amplifier 350 is shown in accordance with an example embodiment of the invention. A design of the amplifier 350 may be representative of both amplifiers 350a-350b. In various embodiments, the amplifier 350 may implement two cascode amplifiers, one for each half of the differential signal IP1 and IN1.

A common base portion of the cascode amplifiers for the positive signal IP1 generally comprises multiple transistors MA-MC having all three emitter nodes tied together. A common emitter portion of the cascode amplifiers may include multiple transistors MD and ME having both collector nodes tied together and connected to the emitter nodes of the transistors MA-MC. The amplifier 350 may further comprise a similar set of transistors MF-MJ for the negative signal IN1.

Base nodes of the transistors MA and MH may be controlled by a signal (e.g., CT1) to provide adjustments to amplitudes of the signals IP2/IN2 relative to the signals IP/IN1. The signal CT1 may be a component of the control signal CT. The signal CT1 may be used to completely zero the gain from the amplifier 350. The zero gain feature is generally used for setting the corresponding vector (e.g., I or Q) to zero. The zero gain feature may provide an accurate and robust phase shifting between 0 degrees, 90 degrees, 180 degrees and 270 degrees, depending on the sign of the vector.

Base nodes of the transistors MC and MG may be controlled by a signal (e.g., CT2) to provide additional adjustments to the amplitudes of the signals IP2/IN2 relative to the signals IP/IN1. In various embodiments, signal CT2 may be a component of the control signal CT. In some embodiments, the signal CT2 may be a fixed DC bias at virtual radio-frequency ground for cascode operations.

Implementing two transistor devices with separate emitters for both the positive side and the negative sides generally enables switching the sign of the vector by activating positive branch or negative branch accordingly. The sign switching may be achieved using a tail current mirror setting the bias located under the emitter degeneration resistors RA-RD in the signals EMITP1, EMITP2, EMITN1 and EMITN2. When the signal CT1 is low, the signal ICONT may be used to set the variable-amplitude gain by finer steps. The signal ICONT may be controlled by a digitally controlled current mirror. In some embodiments, the current mirror may include a digital-to-analog converter. The digital-to-analog converter may have different numbers of digital control bits, depending on a desired resolution of control. In various embodiments, each transistors may be implemented as, but is not limited to a bipolar junction transistor (BJT), a heterojunction bipolar transistor (HBT), a metal-oxide-silicon field-effect transistor (MOSFET), a pseudomorphic high-electron-mobility transistor (pHEMT) and/or a silicon-on-insulator (SOI) transistor.

Figure 8:
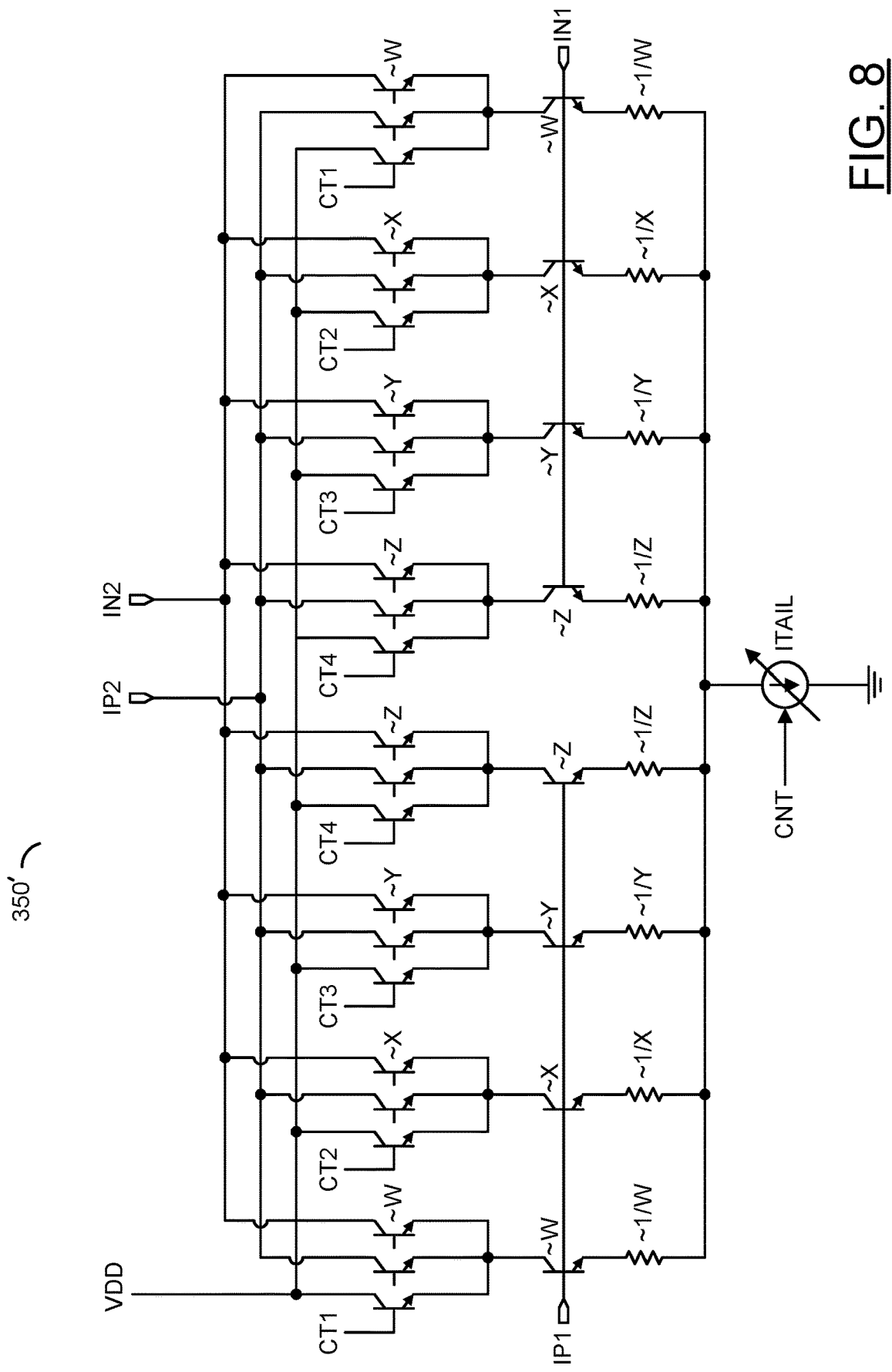
FIG. 8 is a diagram illustrating another variable gain amplifier in accordance with an example embodiment of the invention.

Referring to FIG. 8, a diagram illustrating another example implementation of an amplifier 350' is shown in accordance with an example embodiment of the invention. A design of the amplifier 350' may be representative of both amplifiers 350a-350b. In various embodiments, the amplifier 350' may implement multiple parallel cascode amplifiers (or amplifications) for each half of the differential signals IP1 and IN1.

The amplifier 350' generally comprises multiple (e.g., four sets) of transistors for each half of the differential signal IP1/IN1 connected in parallel. The number of branches may be adjusted according to achieve a desired resolution. The transistor sets may form the common base portions of the cascode amplifiers. Each transistor set may comprise multiple (e.g., three) individual transistors. Emitter nodes of each transistor in each transistor set may be connected together. A collector node of one of the transistors in each transistor set may be connected to power (e.g., VDD). The collector node of another of the transistors in each transistor set may be connected to a common node to present the signal IP2. The collector node of yet another of the transistors in each transistor set may be connected to another common node to present the signal IN2. In some embodiments, all of the transistors may be implemented as NPN bipolar transistors. Other transistor polarities and/or technologies may be implemented to meet the design criteria of a particular application.

A group of transistors may form the common emitter portions of the cascode amplifiers. The base nodes of half the transistors in the common emitter portions may receive the signal IP1. The base nodes of the other half of the transistors may receive the signal IN1. The emitter nodes of the transistors in the common emitter portions may be connected to a variable current source ITAIL through a corresponding resistor. The collector nodes of the transistors in the common emitter portions may each be connected to the emitter nodes of a respective one of the common base portions of the amplifier 350'. In some embodiments, all of the transistors may be implemented as NPN bipolar transistors. Other transistor polarities and/or technologies may be implemented to meet the design criteria of a particular application.

The transistors may be weighted counter-proportional to the corresponding resistive degeneration at the emitter nodes for a mismatch and process variation resilient gain weighting. For example, all transistors in a first transistor set and the corresponding common emitter portion transistor for the signal IP1 may have a weight of approximately W. The corresponding emitter resistor may have an inverse weight of approximately 1/W. All transistors in a second transistor set and the corresponding common emitter portion transistor for the signal IP1 may have a weight of approximately X. The corresponding emitter resistor may have an inverse weight of approximately 1/X. All transistors in a third transistor set and the corresponding common emitter portion transistor for the signal IP1 may have a weight of approximately Y. The corresponding emitter resistor may have an inverse weight of approximately 1/Y. All transistors in a fourth transistor set and the corresponding common emitter portion transistor for the signal IP1 may have a weight of approximately Z. The corresponding emitter resistor may have an inverse weight of approximately 1/Z. Similar weighting may be used for the transistors and resistors for the signal IN1. In various embodiments, each transistors may be implemented as, but is not limited to a bipolar junction transistor (BJT), a heterojunction bipolar transistor, a metal-oxide-silicon field-effect transistor, a pseudomorphic high-electron-mobility transistor and/or a silicon-on-insulator transistor.

Multiple signals (e.g., CT1-CT4) may be used to steer the current ITAIL among the power rail VDD and the RF output nodes for the signals IP2 and IN2 to achieve the coarse gain control steps. The signals CT1 through CT4 may be digitally controlled and any node that is set to a logical one (or high voltage) generally eliminates the gain from the corresponding branch. For example, a high voltage on a signal CT1-CT4 may switch on the corresponding transistor and thus route part of the current ITAIL to VDD instead of the signals IP2/IN2. The base nodes of the other transistors in each transistor set may be set to fixed bias levels.

Each cascode branch may have three transistor devices in parallel. Apart from the transistors directly controlled by the signals CT1-CT4, the other transistors may be used for swapping the sign of the signal by cross connection between positive cascode base and the positive and negative collector for each device. The same sign swapping function may be performed in the amplifier 350' with cascode cross connection as is achieved by the bias activation through the tail current in the amplifier 350 illustrated in FIG. 7. The cascode cross connection generally eliminates implementing multiple current mirrors as in the amplifier 250, and may simplify implementation of fine current control for the signal ITAIL through a digitally controlled current mirror.

The current source ITAIL may be controlled by the signal CNT. The current ITAIL may be scaled by using a digital-to-analog converter and current mirror in order to perform fine gain control steps. The signals CT1-CT4 and CNT may be components of the signal PHASE CONTROL.

To achieve a high N-bit (e.g., 6-bit) resolution with a robust response, the multiple (e.g., four) cascade cores may be implemented for each side of the signal IP1/IN1 with weighting, and multiple (e.g., four) digital-to-analog conversion states may be implemented to control the current ITAIL. Other numbers of cascade amplification cores and/or resolution of the digital-to-analog conversion may be implemented to meet the design criteria of a particular application.

Gain control with the switched cascode cores generally provide a robust phase response versus the input power level in the signals IP1/IP2. The gain control due to scaling the signal ITAIL may be designed for a maximum of approximately 2 decibels (dB). The 2 dB maximum gain may ensure that phase response of the amplifier 350' does not get distorted until the input power levels get close to an output power 1 dB (P1 dB) compression point. If scaling of the current ITAIL is used for gain control levels above 2 dB, the higher gains may affect the input power handling of the corresponding voltage gain amplifier (I or Q core) and may result in a phase distortion at higher power levels.

An advantage of the amplifier 350' may be a phase robust response versus various gain states. The gain control through cascode switching (e.g., control per the signals CT1-CT4) may cause a complementary phase shift in the amplifier 350' when compared to the gain control mechanism through scaling the signal ITAIL. The complementary behavior may ensure that the undesired phase shift from the amplifier 350' stays low all the time even though the gain may be significantly changed. Implementations of the amplifiers 350 and/or 350' in the variable phase shifters 322 and 332 may be used to scale the vector magnitude only and the vectors are generally assumed to be orthogonal to each other. Any unexpected phase shift in a vector itself may distort the overall phase shifting response of the variable phase shifters 322 and 332. The orthogonality generally makes the implementation of the phase the variable phase shifters 322 and 332 more straight-forward.

Figure 9:
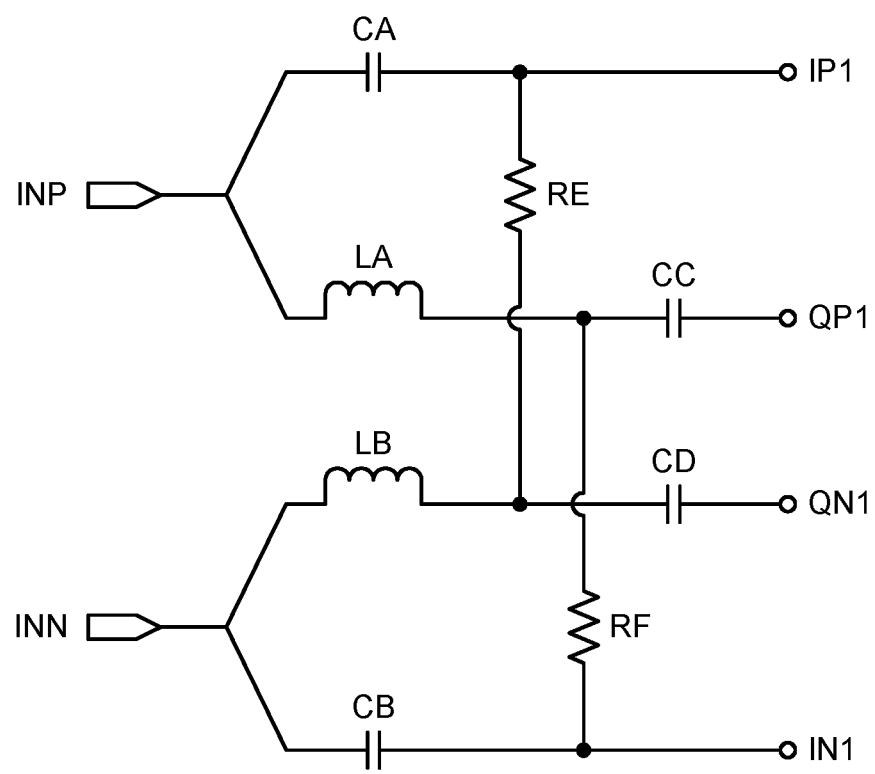
FIG. 9 is a diagram illustrating an I/Q network in accordance with an example embodiment of the invention.

Referring to FIG. 9, a diagram illustrating an example implementation of the I/Q network 342 is shown in accordance with an example embodiment of the invention. The I/Q network 342 is generally operational to generate I and Q branches of the differential signal INP/INN with 90-degree phase differences. The I/Q network 342 generally comprises multiple capacitors CA-CD, multiple inductors LA-LB and multiple resistors RE-RF.

The capacitor CA may be connected between an input node for the signal INP and an output node for the signal IP1. The capacitor CB may be connected between an input node for the signal INN and an output node for the signal IN1. The inductor LA and the capacitor CC may be connected in series between the input node for the signal INP and an output node for the signal QP1. The inductor LB and the capacitor CD may be connected in series between the input node for the signal INN and an output node for the signal QN1. The resistor RE may be connected between the output node for the signal IP1 and the output node for the signal QN1. The resistor RF may be connected between the output node for the signal QP1 and the output node for the signal IN1.

In various embodiments, capacitance values of the capacitors CA and CB may match. For example, the capacitance values for capacitors CA and CB may be approximately 325 femto-farads. Capacitance values of the capacitors CC and CD may also match. For example, the capacitance values for capacitors CC and CD may be approximately 224 femto-farads. Inductive values of the inductors LA and LB may be the same. For example, the inductance values of the inductors LA and LB may be approximately 478 pico-henrys. The resistance values of the resistors RE and RF may also match. For example, the resistance value of the resistors RE and RF may be approximately 73.8 ohms. In various embodiments, additional capacitor may be in series for the signals IP1 and IN1. The additional capacitors may have matching capacitance values of approximately 1.24 pico-farads.

The capacitors CA/CB and the inductors LA/LB generally provide the 90-degree phase difference between the branches. The resistors RE and RF may decrease a Q of the overall network for a wider phase response. The capacitors CC and CD may be used to scale the signals QP1 and QN1 in order to have matching amplitudes for the Q and I branches. In common designs, a matching network is placed between the QAF core and the VGA core. In various embodiments, the I/Q network 342 may be co-optimization by using the capacitive loading of the vector modulator 344 (e.g., the capacitive loading of the amplifiers 350a-350b) and the scaling effect of the capacitors CC and CD. The co-optimization generally provides a wideband characteristic for the phase and gain response of the phase shifter 340.

Although embodiments of the invention have been described in the context of a fifth-generation (5G) application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio-frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The functions and structures illustrated in the diagrams of FIGS. 1 to 9 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a first circuit configured to generate a pair of quadrature signals from a radio-frequency signal; and
a plurality of second circuits each comprising a plurality of cascode amplifiers, wherein (i) said cascode amplifiers are connected in parallel, (ii) said cascode amplifiers are configured to generate a plurality of intermediate signals by modulating said quadrature signals in response to a first control signal and a second control signal, (iii) said first control signal switches a contribution of said cascode amplifiers to said intermediate signals, (iv) said second control signal adjusts a total current passing through all of said cascode amplifiers, and (v) said cascode amplifiers each comprise a plurality of transistors scaled relative to neighboring ones of said cascode amplifiers to make different contributions to said intermediate signals.

2. The apparatus according to claim 1, wherein said modulation does not vary in response to process variations, voltage variations and temperature variations.

3. The apparatus according to claim 1, wherein said first circuit comprises a wideband quadrature all-pass filter.

4. The apparatus according to claim 1, further comprising a third circuit configured to generate an output signal by adding said intermediate signals, wherein said output signal has a programmable phase relative to said radio-frequency signal.

5. The apparatus according to claim 1, wherein (i) each of said cascode amplifiers is coupled to a variable current source through a corresponding resistor and (ii) said corresponding resistors are scaled inversely to said transistors.

6. The apparatus according to claim 5, wherein said second control signal adjusts a current of said variable current source.

7. The apparatus according to claim 1, wherein (i) said first control signal comprises a plurality of components and (ii) each one of said components controls one of a plurality of transistors in a corresponding one of said cascode amplifiers.

8. The apparatus according to claim 1, wherein said radio-frequency signal has a frequency of at least one of (i) a radio frequency, (ii) a millimeter-wave frequency, (iii) a microwave frequency or (iv) any combination thereof.

9. The apparatus according to claim 1, wherein said radio-frequency signal has a frequency in a range of 24 gigahertz to 44 gigahertz.

10. The apparatus according to claim 1, wherein said first circuit and said second circuit form part of a two-dimensional antenna network.

11. The apparatus according to claim 1, wherein said first circuit and said second circuit form part of a fifth-generation wireless communications system.

12. A method for vector modulation and phase shifting, comprising steps of:
generating a pair of quadrature signals based on a radio-frequency signal; and generating a plurality of intermediate signals using a plurality of circuits by modulating said quadrature signals in response to a first control signal and a second control signal, wherein (i) each of said circuits is configured as a plurality of cascode amplifiers, (ii) said cascode amplifiers are connected in parallel, (iii) said first control signal switches a contribution of said cascode amplifiers to said intermediate signals, (iv) said second control signal adjusts a total current passing through all of said cascode amplifiers, and (v) said cascode amplifiers each comprise a plurality of transistors scaled relative to neighboring ones of said cascode amplifiers to make different contributions to said intermediate signals.

13. The method according to claim 12, further comprising the step of:

generating an output signal by adding said intermediate signals, wherein said output signal has a programmable phase relative to said radio-frequency signal.

14. The method according to claim 12, wherein the steps are implemented in (i) a two-dimensional antenna network, (ii) a fifth-generation wireless communications system or (iii) any combination thereof.

* * * * *